United States Patent
Hu et al.

(10) Patent No.: US 7,167,109 B2
(45) Date of Patent: Jan. 23, 2007

(54) HYBRID FRACTIONAL-BIT SYSTEMS

(76) Inventors: Chenming Hu, 2060 Pebble Dr., Alamo, CA (US) 94520; Guobiao Zhang, P.O. Box 6182, Stateline, NV (US) 89449-6182

(*) Notice: Subject to any disclaimer, the term of this patent is extended or adjusted under 35 U.S.C. 154(b) by 144 days.

(21) Appl. No.: 10/907,438

(22) Filed: Mar. 31, 2005

(65) Prior Publication Data
US 2006/0227021 A1    Oct. 12, 2006

Related U.S. Application Data

(60) Provisional application No. 60/594,353, filed on Mar. 31, 2005.

(51) Int. Cl.
*H03M 5/02* (2006.01)
(52) U.S. Cl. .......................... 341/56; 341/57
(58) Field of Classification Search ................ 341/105, 341/106, 97, 85, 62, 57, 56; 375/286, 287
See application file for complete search history.

(56) References Cited

U.S. PATENT DOCUMENTS

| | | | |
|---|---|---|---|
| 5,103,227 A * | 4/1992 | Betts ........................... | 341/61 |
| 5,498,980 A | 3/1996 | Bowles ......................... | 326/60 |
| 5,633,631 A | 5/1997 | Teckman ....................... | 341/58 |
| 5,659,579 A * | 8/1997 | Herzberg ...................... | 375/262 |
| 6,040,709 A | 3/2000 | Kishimoto ..................... | 326/59 |
| 6,646,913 B2 | 11/2003 | Micheloni et al. ............. | 365/185.03 |
| 6,717,532 B2 * | 4/2004 | Noda ........................... | 341/57 |
| 6,816,407 B2 | 11/2004 | Rolandi ........................ | 365/185.03 |
| 2005/0050434 A1 | 3/2005 | Lunelli et al. ................ | 714/793 |

OTHER PUBLICATIONS

Tanaka et al. "A 3.4-Mbyte/sec Programming 3-Level NAND Flash Memory Saving 40% Die Size Per Bit", *1997 Symposium on VLSI Circuits Digest of Technical Papers*, pp. 65-66 no month.
Micheloni et al. "The Flash Memory Read Path: Building Blocks and Critical Aspects", *Proceedings of the IEEE*, pp. 537-551, Apr. 2003.

* cited by examiner

*Primary Examiner*—Brian Young

(57) ABSTRACT

The present invention abandons the conventional approach of incrementing bits-per-cell b by 1, but allows increments of states-per-cell N by as little as 1 between product generations. Because N is no longer an integral power of 2, b takes a fractional value, resulting in a fractional-bit system. In a fractional-bit system, cells are decoded in unit of word. By adjusting the word-width, the system efficiency can be optimized. Hybrid N-ary system can be used to improve manufacturing yield and endurance lifetime.

20 Claims, 15 Drawing Sheets

Table 1. The maximum number of binary bits $n$ that can be represented by $m$ $N$-ary cells.

| $n$ \ $N$ $m$ | 5 | 6 | 7 | 9 | 10 | 11 | 12 | 13 | 14 | 15 |
|---|---|---|---|---|---|---|---|---|---|---|
| 1  | 2  | 2  | 2  | 3   | 3   | 3   | 3   | 3   | 3   | 3   |
| 2  | 4  | 5  | 5  | 6   | 6   | 6   | 7   | 7   | 7   | 7   |
| 3  | 6  | 7  | 8  | 9   | 9   | 10  | 10  | 11  | 11  | 11  |
| 4  | 9  | 10 | 11 | 12  | 13  | 13  | 14  | 14  | 15  | 15  |
| 5  | 11 | 12 | 14 | 15  | 16  | 17  | 17  | 18  | 19  | 19  |
| 6  | 13 | 15 | 16 | 19  | 19  | 20  | 21  | 22  | 22  | 23  |
| 7  | 16 | 18 | 19 | 22  | 23  | 24  | 25  | 25  | 26  | 27  |
| 8  | 18 | 20 | 22 | 25  | 26  | 27  | 28  | 29  | 30  | 31  |
| 9  | 20 | 23 | 25 | 28  | 29  | 31  | 32  | 33  | 34  | 35  |
| 10 | 23 | 25 | 28 | 31  | 33  | 34  | 35  | 37  | 38  | 39  |
| 11 | 25 | 28 | 30 | 34  | 36  | 38  | 39  | 40  | 41  | 42  |
| 12 | 27 | 31 | 33 | 38  | 39  | 41  | 43  | 44  | 45  | 46  |
| 13 | 30 | 33 | 36 | 41  | 43  | 44  | 46  | 48  | 49  | 50  |
| 14 | 32 | 36 | 39 | 44  | 46  | 48  | 50  | 51  | 53  | 54  |
| 15 | 34 | 38 | 42 | 47  | 49  | 51  | 53  | 55  | 57  | 58  |
| 16 | 37 | 41 | 44 | 50  | 53  | 55  | 57  | 59  | 60  | 62  |
| 17 | 39 | 43 | 47 | 53  | 56  | 58  | 60  | 62  | 64  | 66  |
| 18 | 41 | 46 | 50 | 57  | 59  | 62  | 64  | 66  | 68  | 70  |
| 19 | 44 | 49 | 53 | 60  | 63  | 65  | 68  | 70  | 72  | 74  |
| 20 | 46 | 51 | 56 | 63  | 66  | 69  | 71  | 74  | 76  | 78  |
| 21 | 48 | 54 | 58 | 66  | 69  | 72  | 75  | 77  | 79  | 82  |
| 22 | 51 | 56 | 61 | 69  | 73  | 76  | 78  | 81  | 83  | 85  |
| 23 | 53 | 59 | 64 | 72  | 76  | 79  | 82  | 85  | 87  | 89  |
| 24 | 55 | 62 | 67 | 76  | 79  | 83  | 86  | 88  | 91  | 93  |
| 25 | 58 | 64 | 70 | 79  | 83  | 86  | 89  | 92  | 95  | 97  |
| 26 | 60 | 67 | 72 | 82  | 86  | 89  | 93  | 96  | 98  | 101 |
| 27 | 62 | 69 | 75 | 85  | 89  | 93  | 96  | 99  | 102 | 105 |
| 28 | 65 | 72 | 78 | 88  | 93  | 96  | 100 | 103 | 106 | 109 |
| 29 | 67 | 74 | 81 | 91  | 96  | 100 | 103 | 107 | 110 | 113 |
| 30 | 69 | 77 | 84 | 95  | 99  | 103 | 107 | 111 | 114 | 117 |
| 31 | 71 | 80 | 87 | 98  | 102 | 107 | 111 | 114 | 118 | 121 |
| 32 | 74 | 82 | 89 | 101 | 106 | 110 | 114 | 118 | 121 | 125 |

Table 2. *m* values to ensure: A) efficiency $\beta \geq 90\%$; or, B) $\beta$ reaches local maximum, for various *N* values.

| N | A) *m* for $\beta \geq 90\%$ | B) *m* for $\beta$ local maximum |
|---|---|---|
| 5 | $\geq 4$ | 4,7,10,13,16,19,22,25,28,32... |
| 6 | $\geq 2$ | 2,4,7,9,12,14,16,19,21,24,26,28,31... |
| 7 | $\geq 3$ | 5,10,15,20,25,31... |
| 9 | $\geq 1$ | 6,12,18,24,30... |
| 10 | $\geq 1$ | 4,7,10,13,16,19,22,25,28... |
| 11 | $\geq 3$ | 3,5,7,9,11,14,16,18,20,22,24,27,29,31... |
| 12 | $\geq 2$ | 2,4,7,9,12,14,16,19,21,24,26,28,31... |
| 13 | $\geq 2$ | 3,6,10,13,16,20,23,26,30... |
| 14 | $\geq 2$ | 5,10,15,20,25,31... |
| 15 | $\geq 3$ | 10,21,32... |

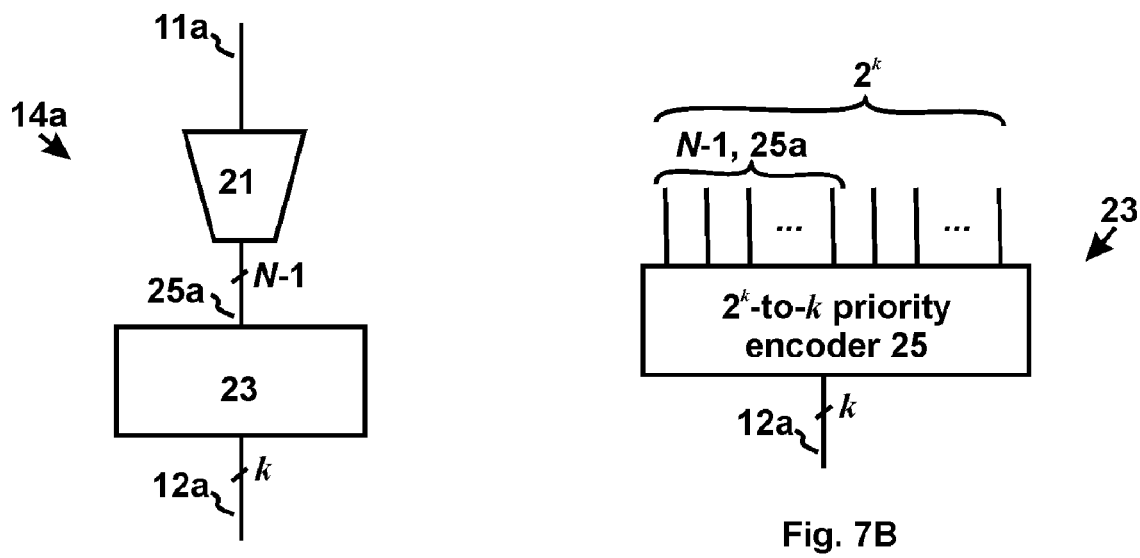
Fig. 7A
Fig. 7B
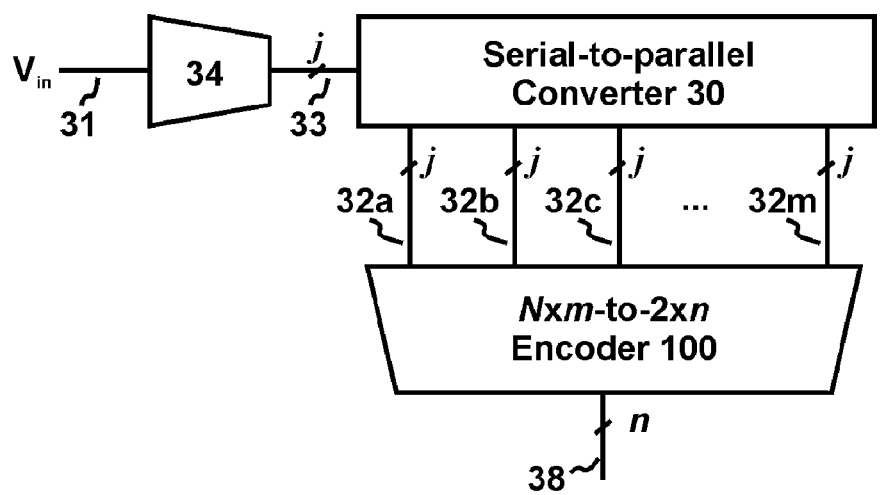
Fig. 8

Table 3A. A preferred truth table for the 6x2-to-2x5 encoder of Fig. 9A.

| $A_{10}$ | A1 A2 A3 A4 A5 (thermometer) | $B_{10}$ | B1 B2 B3 B4 B5 (thermometer) | $C_{10}$ | C0 C1 C2 C3 C4 (binary) |
|---|---|---|---|---|---|
| 0 | 0 0 0 0 0 | 0 | 0 0 0 0 0 | 0 | 0 0 0 0 0 |
| 0 | 0 0 0 0 0 | 1 | 0 0 0 0 1 | 1 | 0 0 0 0 1 |
| 0 | 0 0 0 0 0 | 2 | 0 0 0 1 1 | 2 | 0 0 0 1 0 |
| 0 | 0 0 0 0 0 | 3 | 0 0 1 1 1 | 3 | 0 0 0 1 1 |
| 0 | 0 0 0 0 0 | 4 | 0 1 1 1 1 | 4 | 0 0 1 0 0 |
| 0 | 0 0 0 0 0 | 5 | 1 1 1 1 1 | 5 | 0 0 1 0 1 |
| 1 | 0 0 0 0 1 | 0 | 0 0 0 0 0 | 6 | 0 0 1 1 0 |
| 1 | 0 0 0 0 1 | 1 | 0 0 0 0 1 | 7 | 0 0 1 1 1 |
| 1 | 0 0 0 0 1 | 2 | 0 0 0 1 1 | 8 | 0 1 0 0 0 |
| 1 | 0 0 0 0 1 | 3 | 0 0 1 1 1 | 9 | 0 1 0 0 1 |
| 1 | 0 0 0 0 1 | 4 | 0 1 1 1 1 | 10 | 0 1 0 1 0 |
| 1 | 0 0 0 0 1 | 5 | 1 1 1 1 1 | 11 | 0 1 0 1 1 |
| . . . . . . | . . . . . . | . . . . . . | . . . . . . | . . . . . . | . . . . . . |
| 5 | 1 1 1 1 1 | 0 | 0 0 0 0 0 | 30 | 1 1 1 1 0 |
| 5 | 1 1 1 1 1 | 1 | 0 0 0 0 1 | 31 | 1 1 1 1 1 |
| 5 | 1 1 1 1 1 | 2 | 0 0 0 1 1 | - | not used |
| 5 | 1 1 1 1 1 | 3 | 0 0 1 1 1 | - | not used |
| 5 | 1 1 1 1 1 | 4 | 0 1 1 1 1 | - | not used |
| 5 | 1 1 1 1 1 | 5 | 1 1 1 1 1 | - | not used |

Table 3B. A preferred truth table for the 6x2-to-2x5 encoder of Fig. 9B.

| $A_{10}$ | A1 A2 A3 (quasi-binary) | $B_{10}$ | B1 B2 B3 (quasi-binary) | $C_{10}$ | C0 C1 C2 C3 C4 (binary) |
|---|---|---|---|---|---|
| 0 | 0 0 0 | 0 | 0 0 0 | 0 | 0 0 0 0 0 |
| 0 | 0 0 0 | 1 | 0 0 1 | 1 | 0 0 0 0 1 |
| 0 | 0 0 0 | 2 | 0 1 0 | 2 | 0 0 0 1 0 |
| 0 | 0 0 0 | 3 | 0 1 1 | 3 | 0 0 0 1 1 |
| 0 | 0 0 0 | 4 | 1 0 0 | 4 | 0 0 1 0 0 |
| 0 | 0 0 0 | 5 | 1 0 1 | 5 | 0 0 1 0 1 |
| 1 | 0 0 1 | 0 | 0 0 0 | 6 | 0 0 1 1 0 |
| 1 | 0 0 1 | 1 | 0 0 1 | 7 | 0 0 1 1 1 |
| 1 | 0 0 1 | 2 | 0 1 0 | 8 | 0 1 0 0 0 |
| 1 | 0 0 1 | 3 | 0 1 1 | 9 | 0 1 0 0 1 |
| 1 | 0 0 1 | 4 | 1 0 0 | 10 | 0 1 0 1 0 |
| 1 | 0 0 1 | 5 | 1 0 1 | 11 | 0 1 0 1 1 |
| . . . . . | . . . . . | | . . . . | | . . . . . . |
| 5 | 1 0 1 | 0 | 0 0 0 | 30 | 1 1 1 1 0 |
| 5 | 1 0 1 | 1 | 0 0 1 | 31 | 1 1 1 1 1 |
| 5 | 1 0 1 | 2 | 0 1 0 | - | not used |
| 5 | 1 0 1 | 3 | 0 1 1 | - | not used |
| 5 | 1 0 1 | 4 | 1 0 0 | - | not used |
| 5 | 1 0 1 | 5 | 1 0 1 | - | not used |

HYBRID FRACTIONAL-BIT SYSTEMS

CROSS-REFERENCE TO RELATED APPLICATIONS

This application relates to a provisional application Ser. No. 60/594,353, Filed Mar. 31, 2005.

SYMBOLS USED IN THE SPECIFICATION

N—states-per-cell, i.e. number of possible states per cell, a positive integer;

m—word-width, i.e. number of cells in a word, a positive integer;

n—the maximum number of binary bits that can be represented by m N-ary cells, a positive integer;

b—bits-per-cell, i.e. average number of bits represented by each cell, could be a non-integer;

β—efficiency of N-ary fractional-bit system.

BACKGROUND

1. Technical Field of the Invention

The present invention relates to the field of electronic systems, more particularly to data storage and transmission systems.

2. Prior Arts

Multi-level memory cell can be used to improve the storage density. A multi-level cell (e.g. an N-level flash cell) can store and represent more than two states, e.g. by having N (sates-per-cell, N>2) Vt (threshold voltage) levels. In a conventional multi-level flash, b (bits-per-cell) is an integer. Accordingly, after successfully putting the flash with 2-bit cell into mass production, the industry immediately starts to develop 3-bit cell and 4-bit cell. Although migrating b from 1 to 2 might be easy (N increases from 2 to 4—a difference of 2), from 2 to 3 or even 4 proves quite difficult. This is because, after b=2, each single-step increment of b involves significant increase of N: for example, for b=3, N becomes $2^3$ (=8), which is 4 levels more than b=2; for b=4, N becomes $2^4$(=16), or 8 levels more than b=3. For a given total Vt window (TVW, e.g. 1.5V–6V), this significant increase of N will dramatically reduce the allowed Vt distribution width (for each Vt level) and their separation gap. For example, for b=2, the Vt distribution width can be 0.5V with a separation gap as large as 1.0V (FIG. 1A); for b=3, the Vt distribution width is more than halved to 0.2V with a separation gap of 0.4V (FIG. 1B); for b=4, the Vt distribution width becomes as small as 0.1V with a separation gap of 0.2V (FIG. 1C). To achieve these numbers, it may incur considerable research and development cost, and lost time-to-market. Accordingly, the present invention discloses a fraction-bit storage system. It abandons the conventional approach of incrementing b by 1, but allows increments of N by as little as 1 between product generations. This concept can be readily extended to other data storage and transmission systems.

OBJECTS AND ADVANTAGES

It is a principle object of the present invention to improve the storage density of a storage system.

It is a further object of the present invention to optimize the storage density of a fractional-bit storage system.

It is a further object of the present invention to improve the manufacturing yield of an N-ary storage system.

It is a further object of the present invention to improve the endurance lifetime of an N-ary storage system.

It is a further object of the present invention to improve the transmission bandwidth of a transmission system.

In accordance with these and other objects of the present invention, fractional-bit systems are disclosed.

SUMMARY OF THE INVENTION

In an N-ary system, each cell has N possible states (N—states-per-cell, a positive integer). Physical attributes that may be used to represent the states include threshold voltage, charge, current, voltage, resistance, optical transmission or reflection, thermal conductance, electrical field, magnetic field, etc. N-ary system includes N-ary storage and N-ary transmission. N-ary storage is also referred to as multi-level storage (e.g. multi-level flash) or multi-valued storage. On the other hand, in an N-ary transmission, a cell is the input in a clock cycle.

It has been realized that the conventional approach of incrementing b by 1 between product generations has become impractical. It is a more practical approach to increment b by just a fraction of 1 between product generations. This smaller incremental step enables a more relaxed and more realistic product roadmap. Accordingly, the present invention abandons the conventional approach of incrementing b by 1, but allows increments of N by as little as 1 between product generations. For example, after b=2 (N=4), instead of directly going to b=3 (N=8), the next product generation to develop is N=5, 6, 7 . . . Because N is not an integral power of 2 and b takes a fractional value (i.e. is a non-integer), this N-ary system is referred to as fractional-bit system. From the discussion in the "Prior Arts" section, fractional-bit system is particularly advantageous when b>2.

In a conventional integer-bit system, cell is decoded individually. However, this approach is inefficient for a fractional-bit system (FIG. 4). Thus, in a fractional-bit system, a plurality of cells are decoded collectively—in unit of word. Each word comprises m N-ary cells (m—word-width, m≧2 is a positive integer). In fact, this decoding process simply converts a number from an N-ary representation to a binary representation. Preferably, each cell is first read out to a cell-coding block and converted into j bits. Because these j bits represent more states ($2^j$) than the cell states (N), they are referred to as binary-like code. Examples of binary-like code include thermometer code (FIGS. 6A–6C, Table 3A) and quasi-binary code (FIGS. 7A–7B, Table 3B). After being processed by the cell-coding blocks, binary-like codes from m cells are then collectively fed into an N-ary-to-binary encoder and converted into i binary bit, where $$i \leq INT[\log_2(N^m)]$$

(INT[x] is the largest integer smaller than x); its maximum value n is:

$$n = i_{max} = INT[\log_2(N^m)]$$

(Table 1) and bits-per-cell b, i.e. average number of bits represented by each cell, is then:

$$b = n/m = INT[\log_2(N^m)]/m$$

(FIG. 3), which takes a fractional value.

Because it occupies chip real estate, an N-ary-to-binary encoder is preferably shared by a plurality of words. An address decoder (or a mux) can be used to select one word from said plurality of words. An N-ary-to-binary encoder can be shared within a memory unit-array, between different unit-arrays, or even between different chips. It may be located on-chip, external to the memory chip or a combination thereof. An N-ary-to-binary encoder can be programmable. A preferred programmable N-ary-to-binary encoder is comprised of a general-purpose processor and a program. The processor may be shared with other system components, e.g. controller in flash memory or disc drives, thus lowering the system cost.

For a given N, b varies with m. For example, for N=6, when m=1, b=2, i.e. each 2 cells represent 4 bits; when m=2, b=2.5, i.e. each 2 cells represent 5 bits (FIG. 3). Thus, the m=2 grouping has a higher storage density than m=1, or a better efficiency. Accordingly, efficiency β of an N-ary system is defined as the ratio between b and its theoretical limit $b_{limit}$, $$\beta = b/b_{limit} = \{INT[\log_2(N^m)]/m\}/\{\log_2(N^m)/m\}$$

$$= INT[\log_2(N^m)]/\log_2(N^m).$$

For a fractional N-ary system, because N is not an integral power of 2 and not all N-ary states are used during N-ary-to-binary encoding (see, for example, the last 4 rows of Table 3A), β does not reach 100% (FIG. 4). To ensure β≧90%, m needs to satisfy certain conditions, e.g. for N=5, m≧4; for N=6, m≧2; for N=7, m≧3 . . . (FIG. 4 and Table 2); β can be further improved by selecting m values so that β reaches a local maximum, e.g. for N=7, m preferably takes the values of 5, 10, 15, 20, 25, or 31 . . . (FIG. 4 and Table 2).

For an N-ary system whose N in the product specification is N0, a portion of devices may not function properly at N=N0 after manufacturing (due to process variance) or during operation (due to wear-out). In the past, these devices are discarded and this proves wasteful. In fact, they may still be harvested at a smaller N values, N=N*(N*<N0, e.g. N*=N0-1, N0-2 . . . ; for N0=8, N*=7, 6 . . . ), thus improving manufacturing yield and endurance lifetime. Accordingly, the present invention discloses a hybrid N-ary system. Its cells can be operated at multiple N-modes, e.g. N0-mode and N*-mode (these N values are collectively referred to as the N set). Here, N0 or N* may not necessarily be an integral power of 2. The preferred hybrid N-ary system further comprises an N-storage element and a configurable write/read block. The N-storage element 308 could be laser fuse, electrical fuse, antifuse, EPROM, EEPROM, flash memory, or using the same storage mechanism of the system. The information stored therein determines the system mode. The configurable write/read block supports write and read at multiple N-modes, e.g. N0-mode and N*-mode. Its details are disclosed in the following paragraph.

In a hybrid N-ary system, its configurable read block preferably comprises a configurable N-ary-to-binary encoder. It can act as either an N0-ary-to-binary encoder or an N*-ary-to-binary encoder, depending on the N value. Here, processor-based configurable N-ary-to-binary encoder is particularly advantageous because it does not incur extra chip overhead and can be made N (or even m)-programmable. On the other hand, in a configurable N-ary-to-binary encoder with inputs from m cells, the m value can be selected to ensure good overall efficiency β for the N set. One case is to ensure β≧90% for every member in the N set, e.g. m≧4 for N=5, 6, and 7 (Table 2). Another case is to ensure that β reaches local maxima for at least two members in the N set, e.g. m=4 or 7 for N=5, 6, and 7 (Table 2).

Fractional-bit storage can be applied to any storage system, e.g. semiconductor memories such as flash, EPROM, EEPROM, MRAM, FeRAM, DRAM, SRAM, variable-resistance memory such as phase-change memory or Ovonyx unified memory (OUM), mask-programmable memory, diode memory, antifuse memory and others, disc storages such as optical disc storage (e.g. CD, VCD, DVD) and magnetic disc storage (e.g. HDD), or other storage systems. The same concept can be readily extended to any transmission system.

Figure 3:
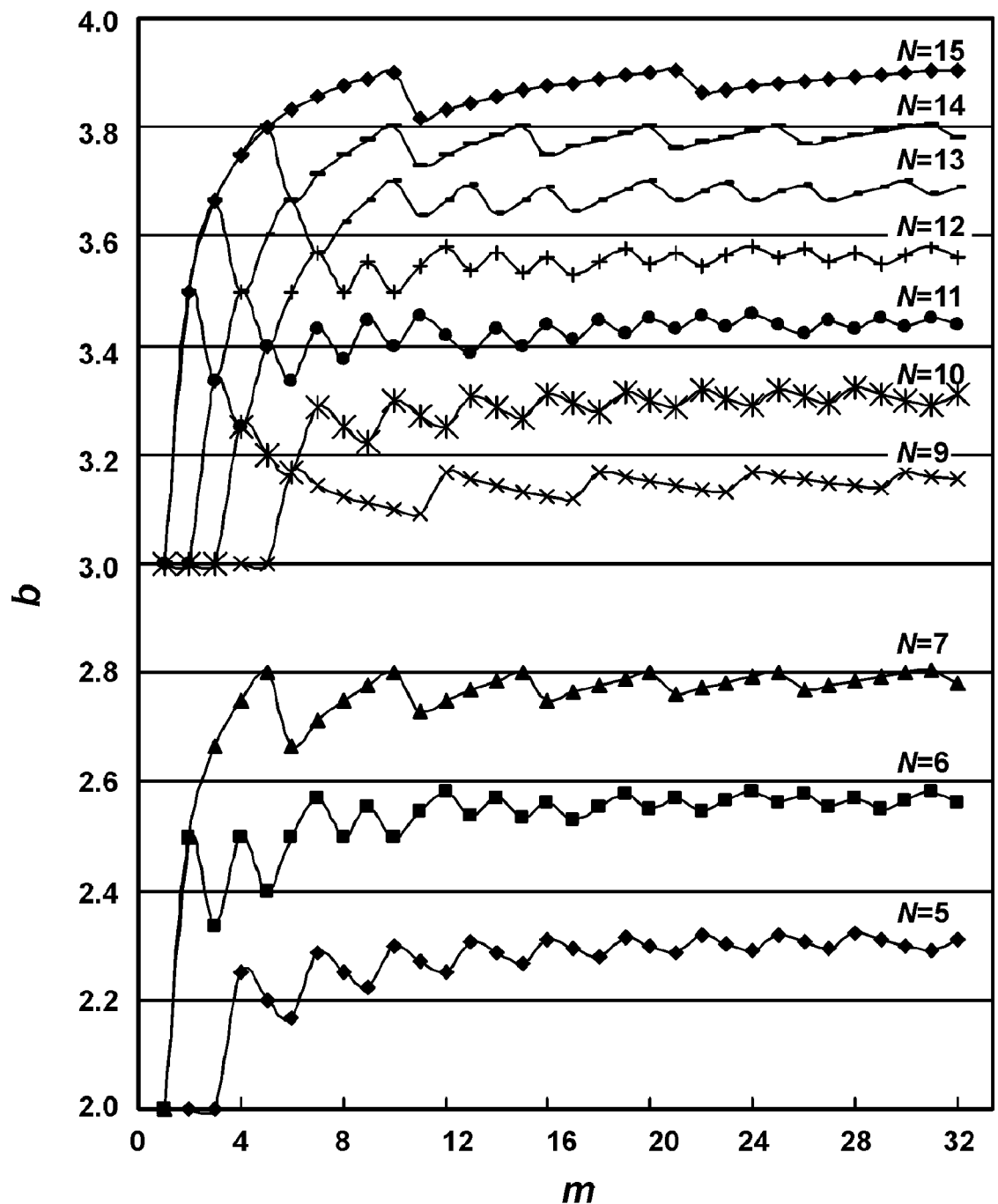
Figure 4:
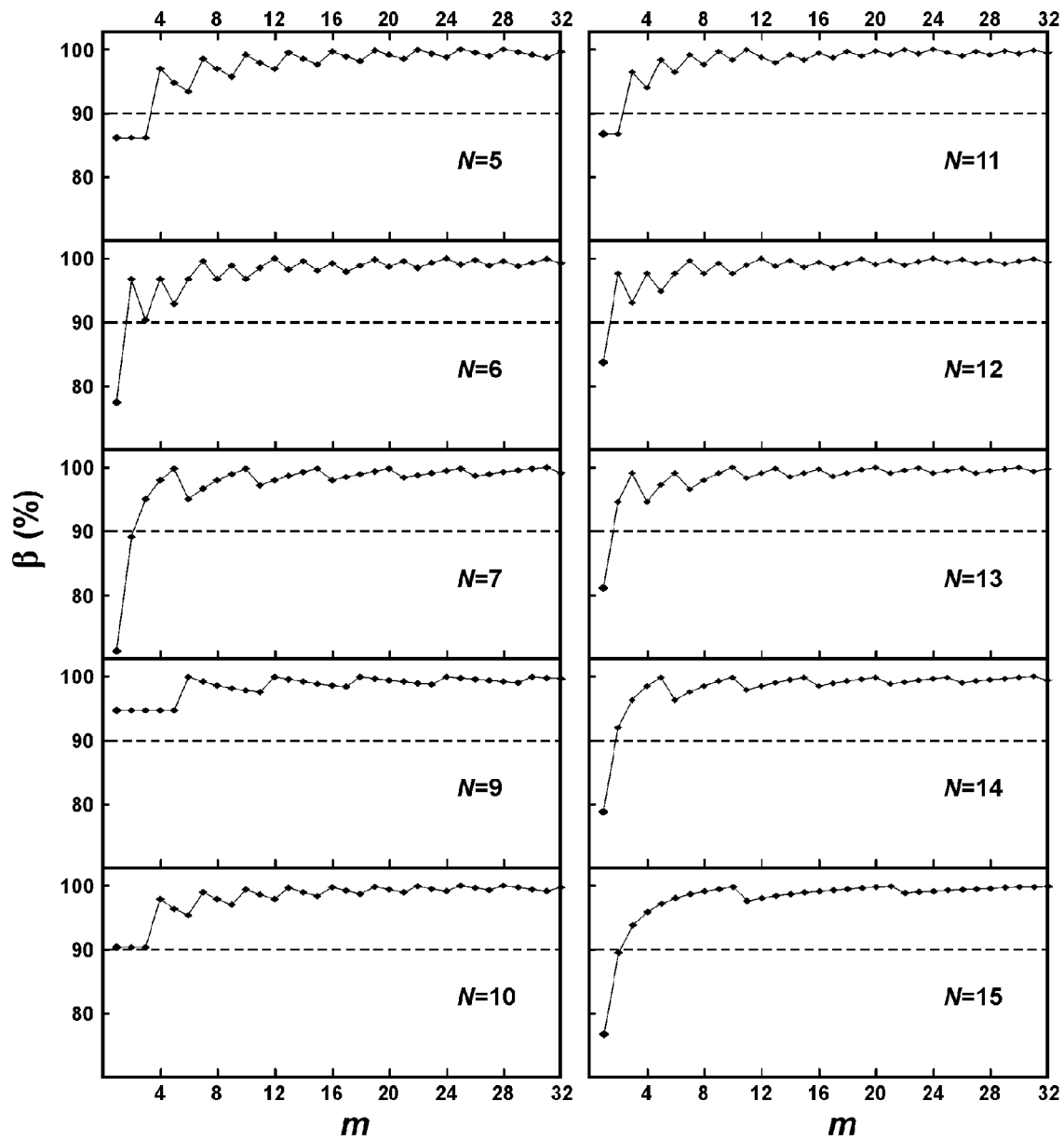
Figures 5, 6A:
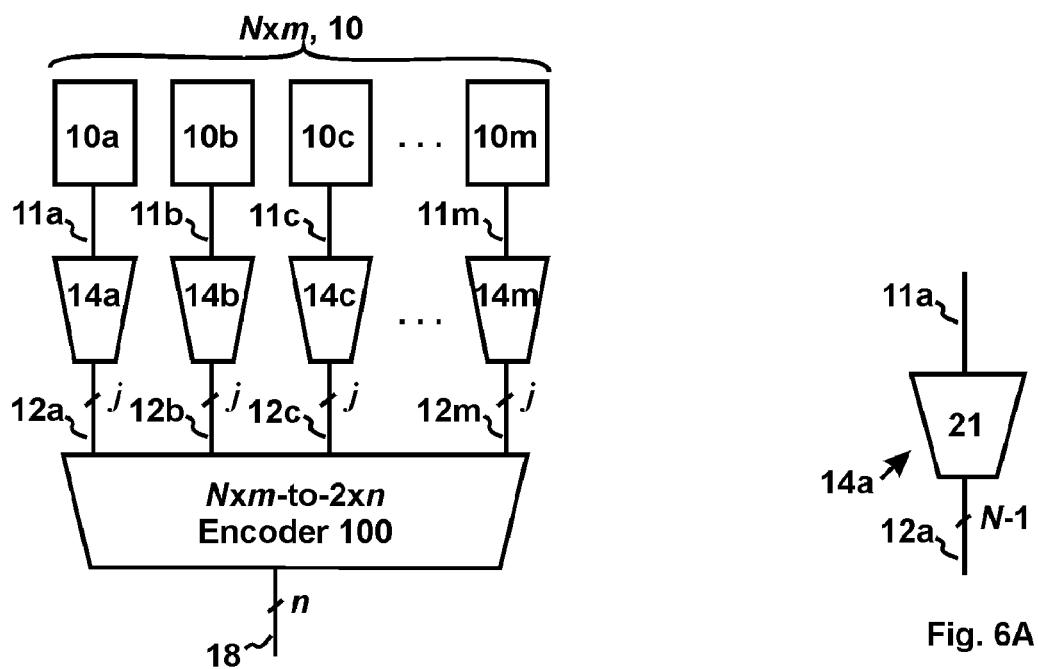
Figure 6B:
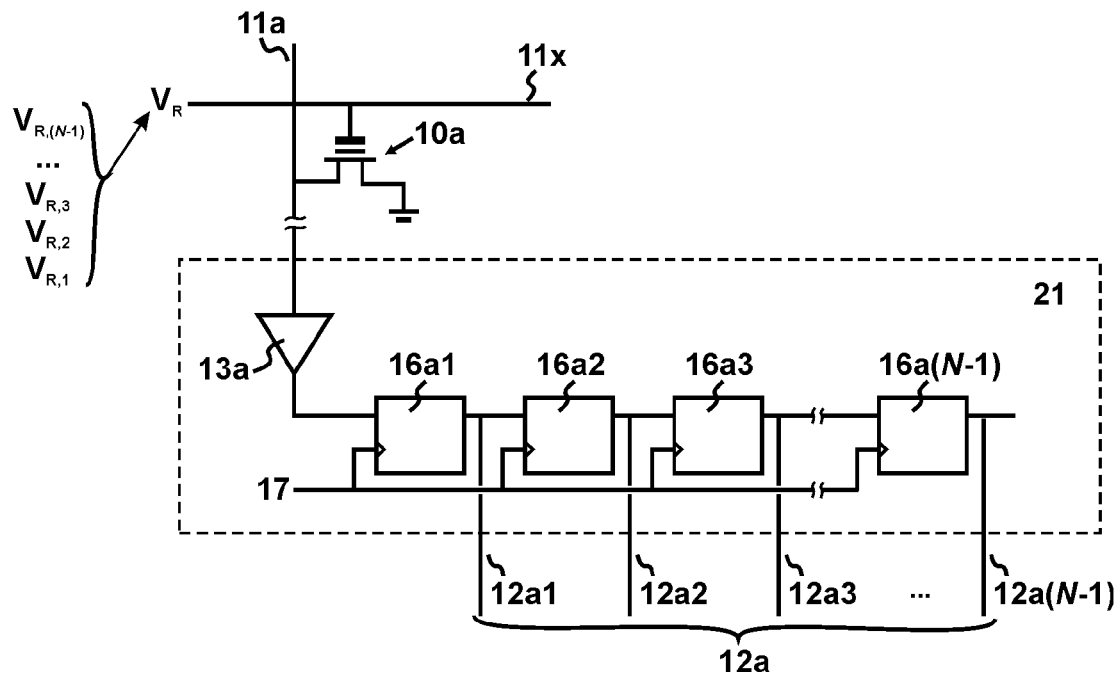
Figure 6C:
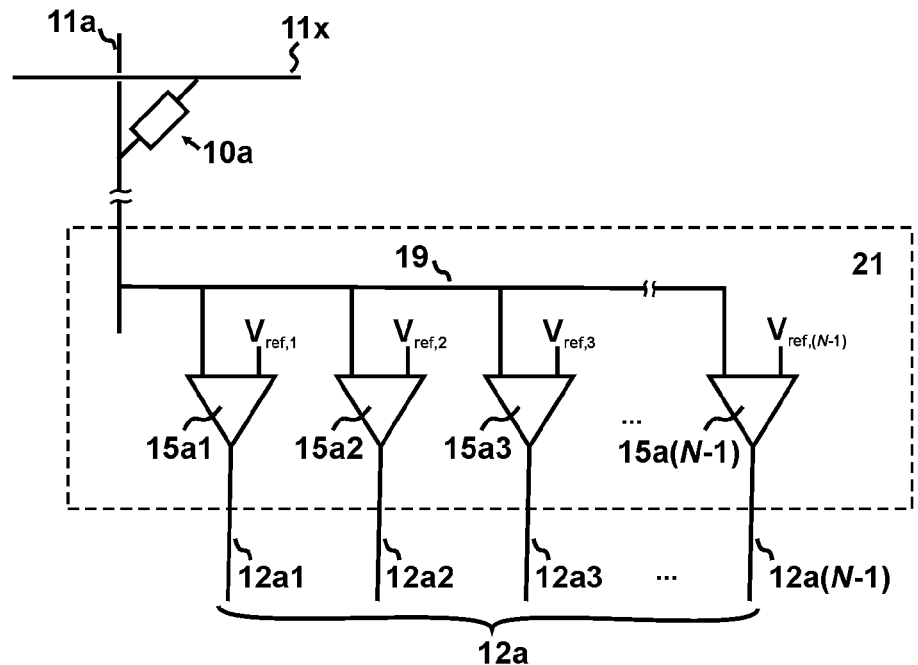
Figure 9A:
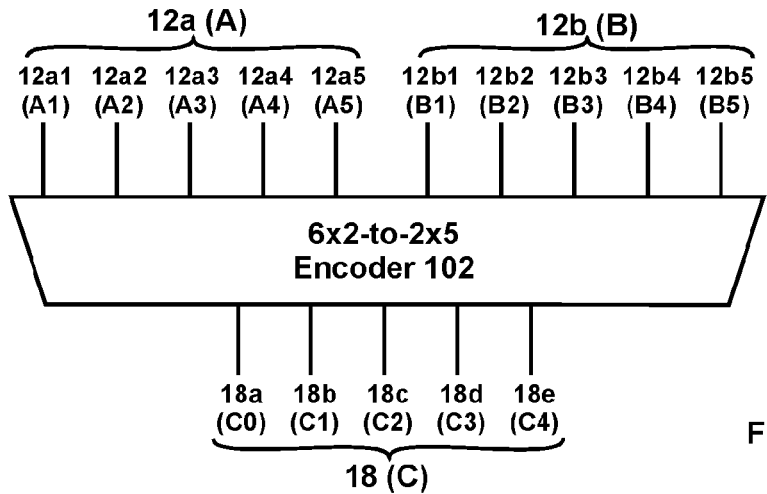
Figure 9B:
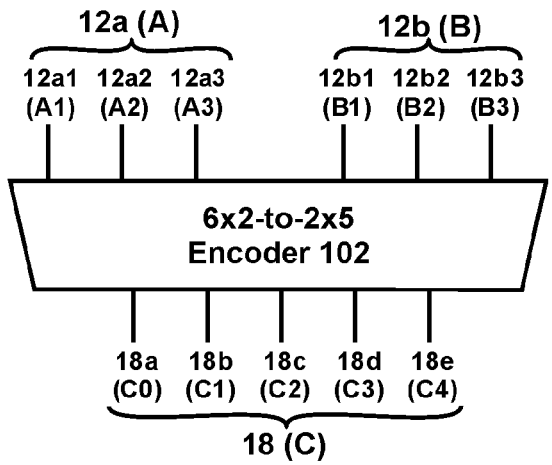
Figure 9C:
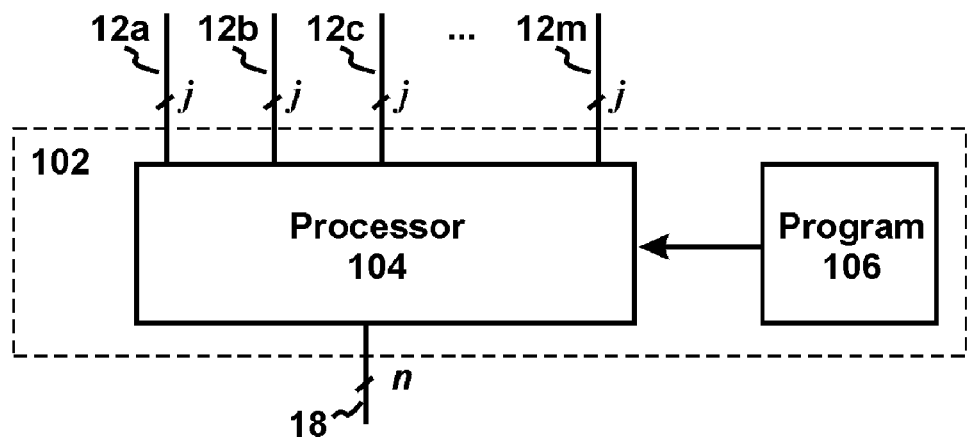
Figure 10:
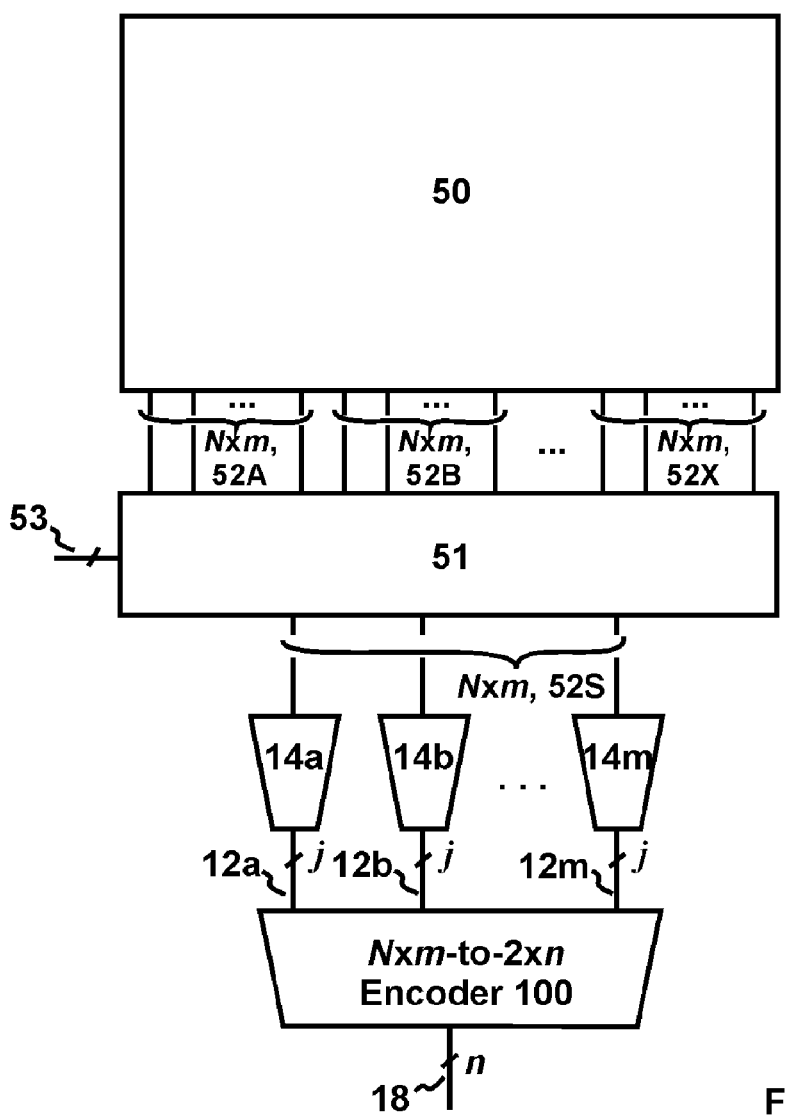
Figure 11A:
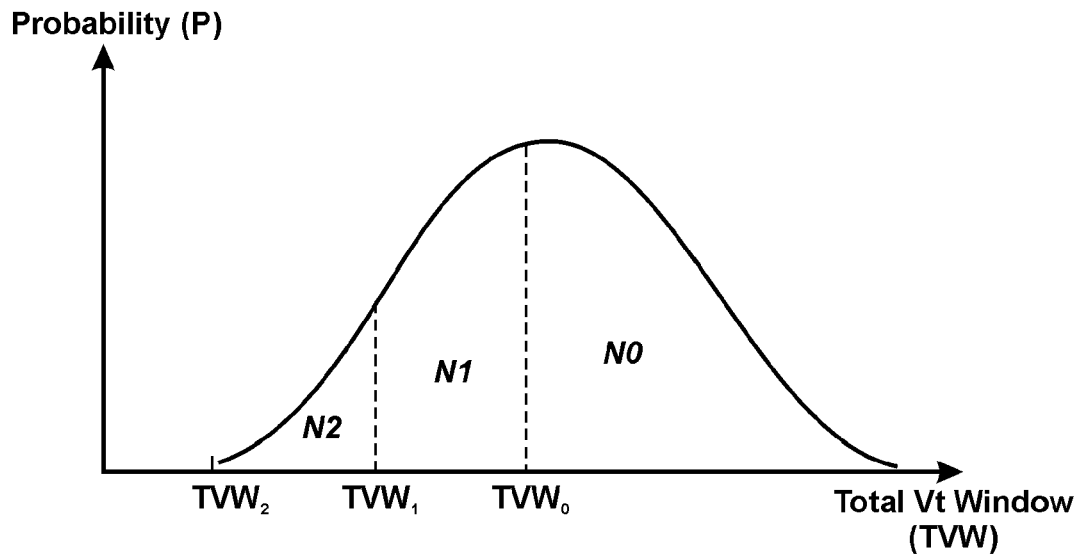
Figure 11B:
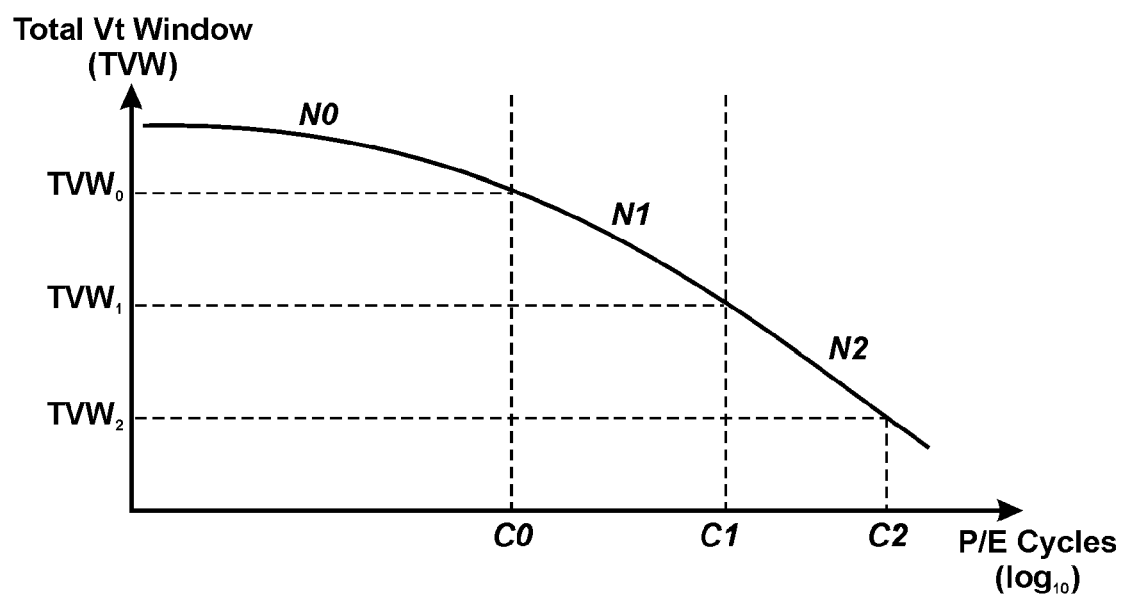
Figure 12A:
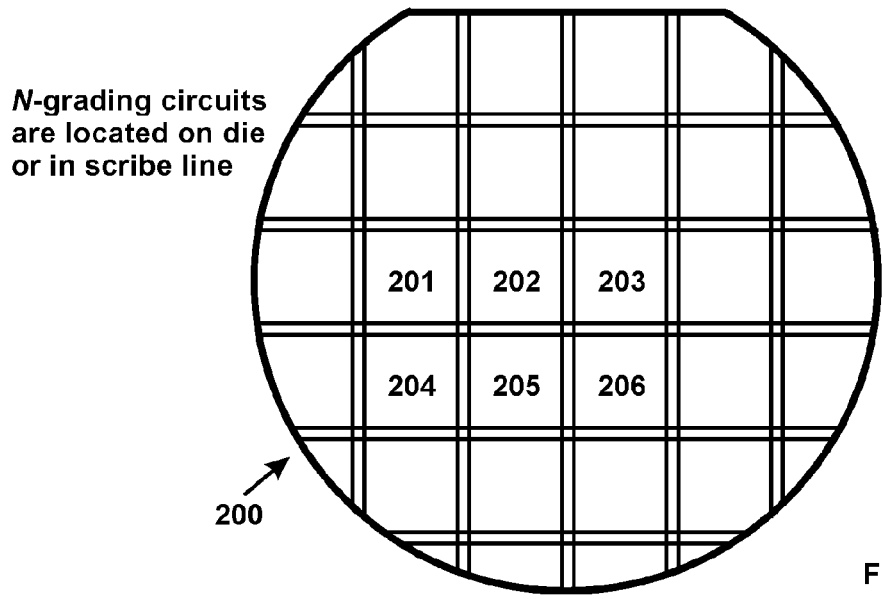
Figure 12B:
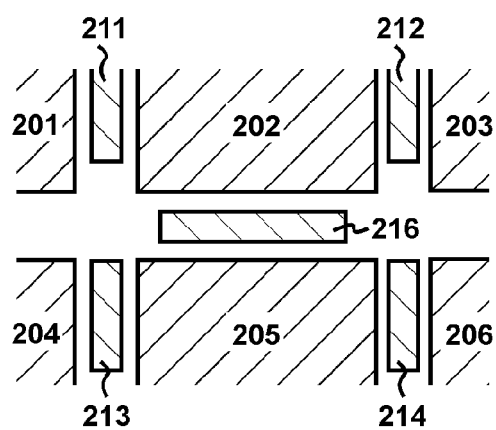
Figure 12C:
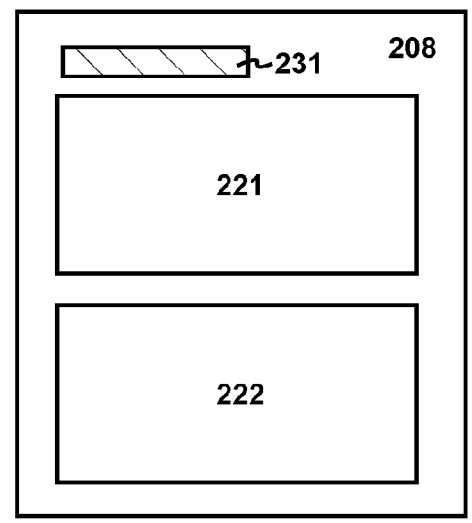
Figure 13A:
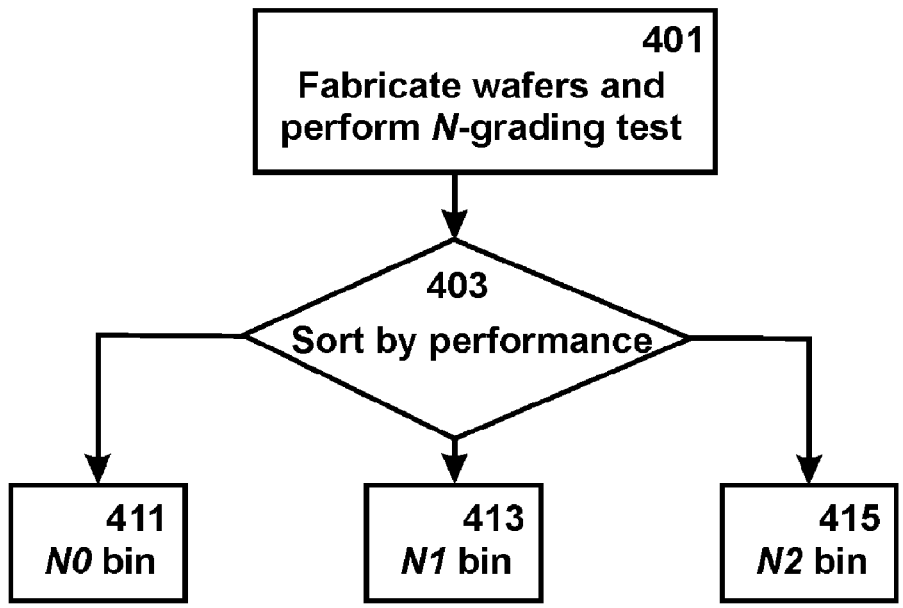
Figure 13B:
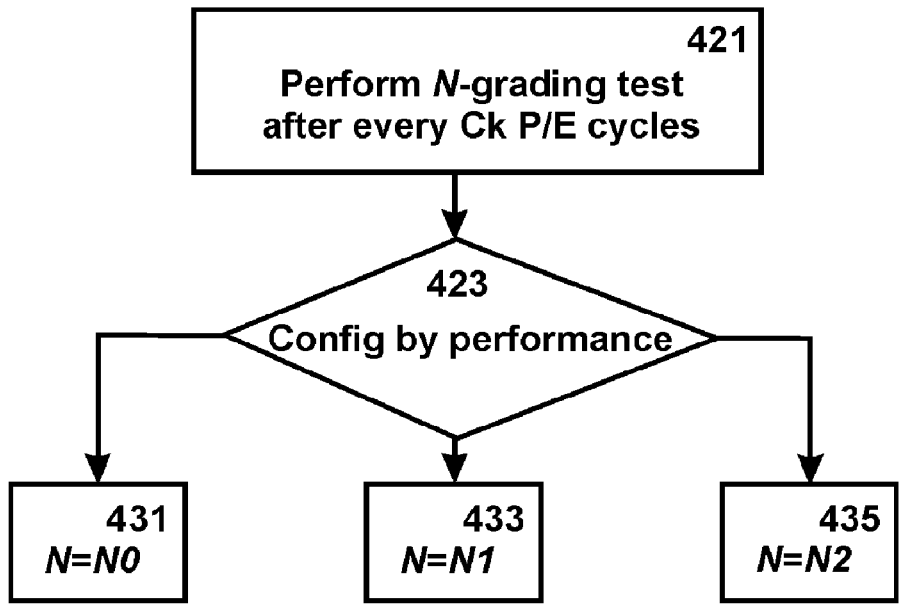
Figure 14:
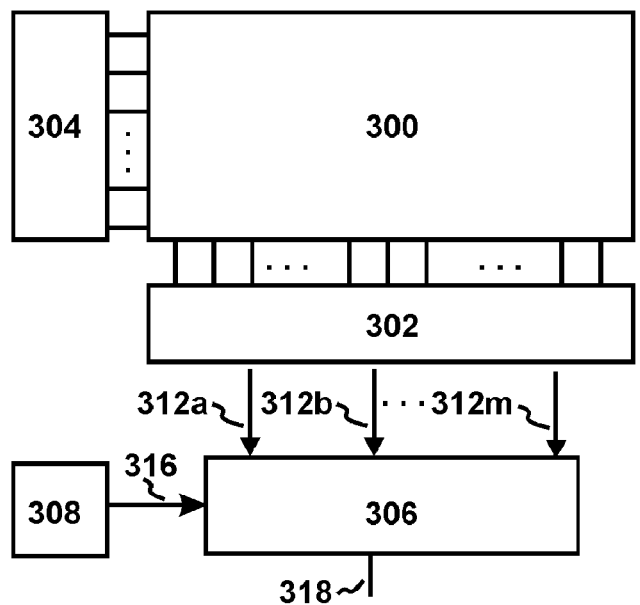
Figure 15A:
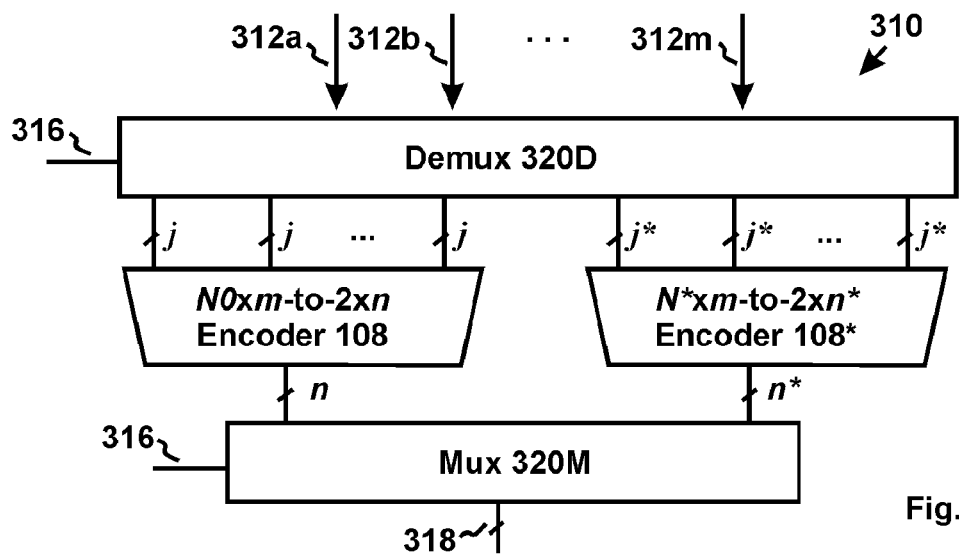
Figure 15B:
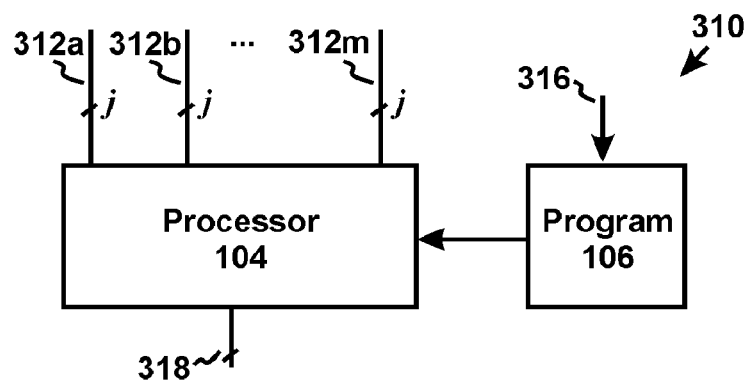

Table 1 lists the maximum number of binary bits n that can be represented by m N-ary cells;

FIG. 3 illustrates bits-per-cell b vs. word-width m for various N values;

FIG. 4 illustrates efficiency β vs. word-width m for various N values;

Table 2 lists the m values that ensure: A) β≧90%; or, B) β reaches local maximum, for various N values;

FIG. 5 illustrates a preferred N-ary fractional-bit parallel-input system;

FIG. 6A is a symbol for a thermometer-coding block; FIG. 6B illustrates a first preferred thermometer-coding block; FIG. 6C illustrates a second preferred thermometer-coding block;

FIG. 7A illustrates a preferred quasibinary-coding block; FIG. 7B illustrates a preferred thermometer-quasibinary conversion block;

FIG. 8 illustrates a preferred N-ary fractional-bit serial-input system;

FIG. 9A illustrates a first preferred 6×2-to-2×5 encoder; Table 3A is a preferred truth table for said first encoder; FIG. 9B illustrates a second preferred 6×2-to-2×5 encoder; Table 3B is a preferred truth table for said second encoder; FIG. 9C illustrates a third preferred programmable N-ary-to-binary encoder;

FIG. 10 illustrates a preferred N-ary fractional-bit memory unit-array;

FIG. 11A illustrates a hypothetical probability distribution for wafers with different TVW (total Vt window); FIG. 11B illustrates a hypothetical TVW closure with increasing P/E (programming/erasure) cycles;

FIG. 12A is a drawing of a wafer with active dice and scribe lines; FIG. 12B is a close-up view of the scribe-line area; FIG. 12C is a close-up view of the active-die area;

FIG. 13A is a flow chart illustrating a preferred N-binning method during manufacturing; FIG. 13B is a flow chart illustrating a preferred N-configuration method during operation;

FIG. 14 illustrates a preferred hybrid N-ary system;

FIG. 15A illustrates a first preferred configurable N-ary-to-binary encoder; FIG. 15B illustrates a second preferred configurable N-ary-to-binary encoder.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Figure 1A:
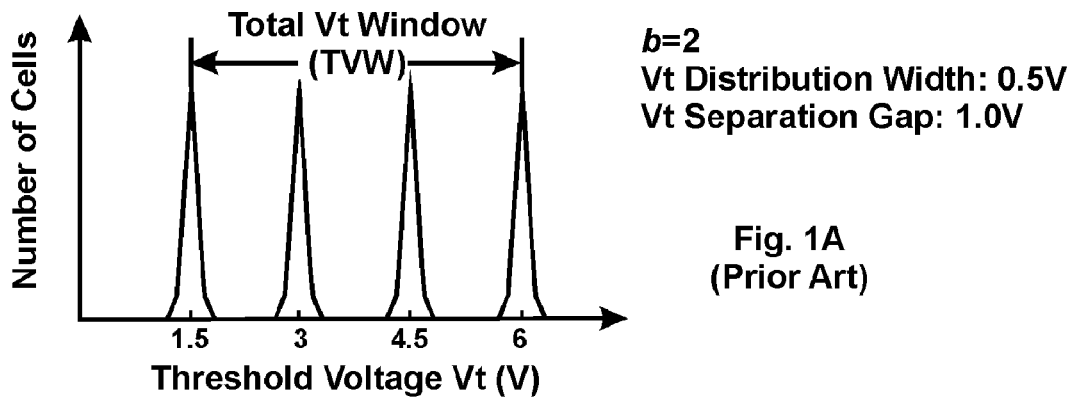
FIGS. 1A–1C illustrate the Vt distribution of 4-ary (b=2), 8-ary (b=3), 16-ary (b=4) flash cells, respectively (prior arts)
Figure 1B:
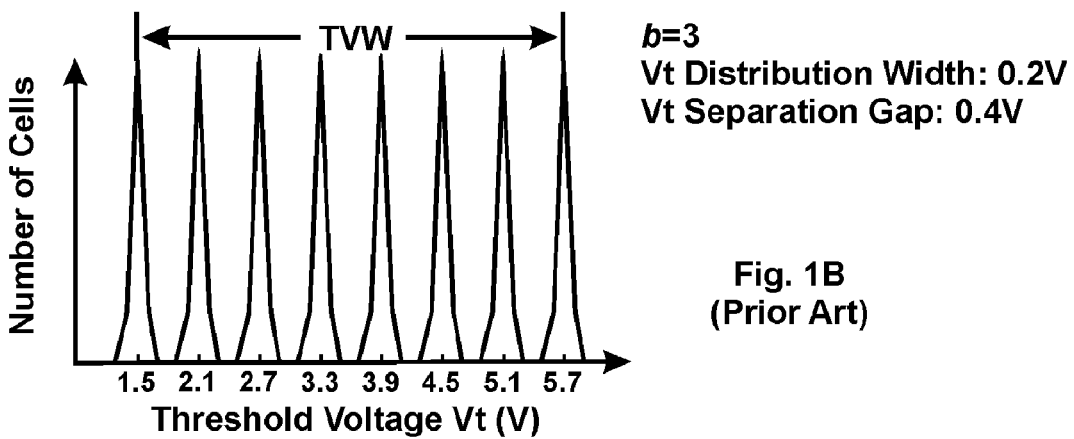
Figure 1C:
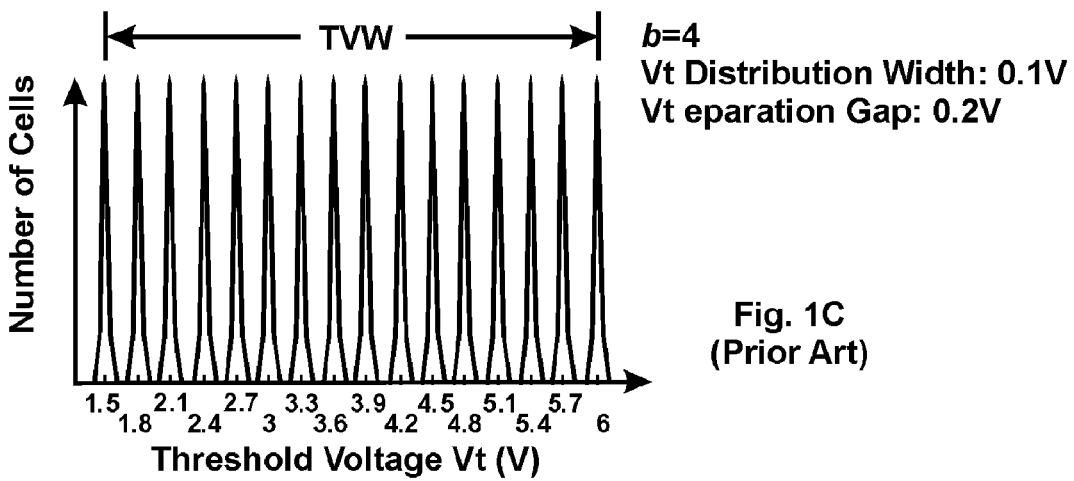
Figure 2A:
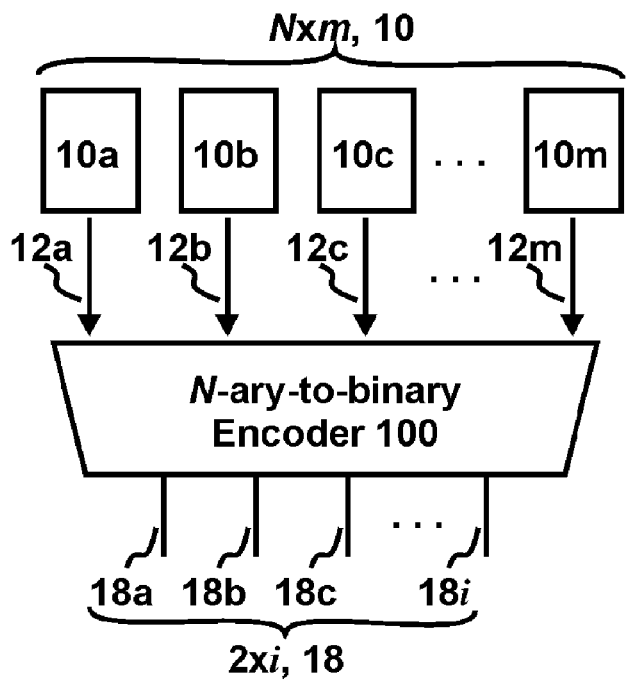
FIG. 2A illustrates a basic N-ary fractional-bit parallel-input system.

FIG. 2A illustrates a basic N-ary fractional-bit parallel-input system. In a parallel-input system, a plurality of cells 5 are accessed in parallel. Typical parallel-input system is semiconductor memory (e.g. flash, EPROM, EEPROM, MRAM, FeRAM, DRAM, SRAM, variable-resistance memory such as phase-change memory or Ovonyx unified memory (OUM), mask-programmable memory, diode memory, antifuse memory, etc.) Semiconductor memory is array-based and easy to provide parallel access. The N-ary fractional-bit parallel-input system in FIG. 2A is comprised of a word 10 and an N-ary-to-binary encoder 100. The word 10 comprises m N-ary cells 10a, 10b . . . 10m, with each cell having N possible states (the expression N×m in FIG. 2A means m N-ary cells or signals). Physical attributes that may be used to represent the states include threshold voltage, charge, current, resistance, voltage, optical transmission or reflection, thermal conductance, electrical field, magnetic field, etc. The read-outs 12a, 12b . . . 12m of these cells are fed into the N-ary-to-binary encoder 100 in parallel and converted into binary outputs 18 with i (i is a positive integer) bits (including 18a, 18b . . . 18i).

Figure 2B:
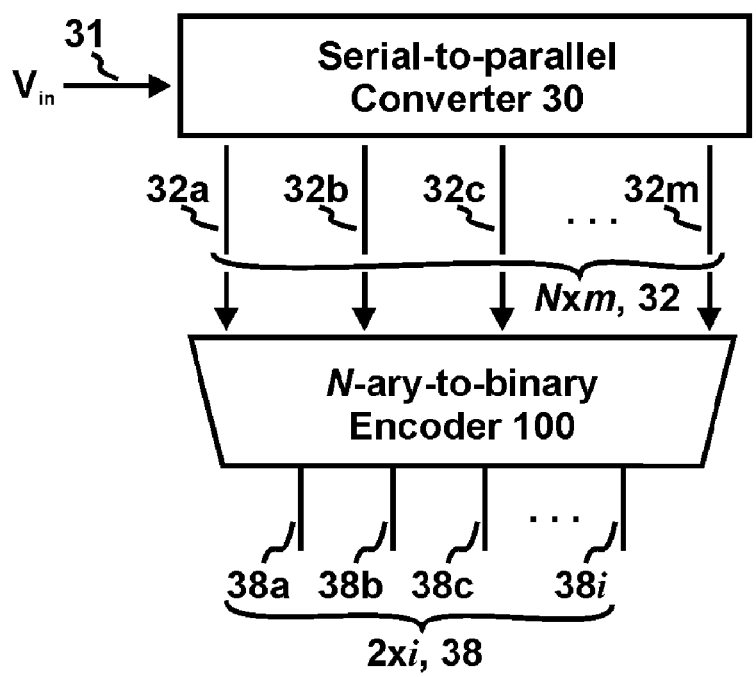
FIG. 2B illustrates a basic N-ary fractional-bit serial-input system.

FIG. 2B illustrates a basic N-ary fractional-bit serial-input system. In a serial-input system, cells are accessed in series. Typical serial-input systems are disc storage (e.g. optical disc storage such as CD, VCD, DVD, magnetic disc storage such as HDD, etc.) and data transmission system. The N-ary fractional-bit serial-input system in FIG. 2B comprises a serial-to-parallel converter 30 and an N-ary-to-binary encoder 100. The input $V_{in}$ 31 has N possible states. Inputs $V_{in}$ 31 from m cells are collected by the serial-to-parallel converter 30 and converted into m parallel signals 32a, 32b . . . 32m. These signals are grouped into a word 32, fed into the N-ary-to-binary encoder 100 and converted into binary outputs 38 with i (i is a positive integer) bits (including 38a, 38b . . . 38i). It should be apparent to those skilled in the art, for a system that is a combination of parallel-input and serial-input systems, it can be implemented by combining designs in FIGS. 2A and 2B.

The essential function of the N-ary-to-binary encoder 100 is to convert a number from an N-ary representation to a binary representation. Based on N-ary logic, the number of binary bits i that can be represented by a word of m N-ary cells should be:

$i \leq INT[\log_2(N^m)]$ (INT[x] is the largest integer smaller than x), its maximum value n is:

$n = i_{max} = INT[\log_2(N^m)]$.

In this case, the N-ary-to-binary encoder 100 in FIGS. 2A and 2B is an N×m-to-2×n encoder, which means that m N-ary cells are converted in n binary bits. Table 1 lists the maximum number of binary bits n that can be represented by m N-ary cells. For example, for four 6-ary cells (i.e. N=6, m=4), n=10; in comparison, for the state-of-the-art four 4-ary (b=2) cells (i.e. N=4, m=4), n=8—a gain of 25%.

The present invention abandons the conventional approach of incrementing b by 1, but allows increments of N by as little as 1 between product generations. For example, after b=2 (N=4), instead of directly going to b=3 (N=8), the next product generation to develop is N=5, 6 . . . This approach demands a more relaxed development investment, while still providing steady improvement of storage density.

It is particularly advantageous when b>2. Because N is not an integral power of 2, bits-per-cell b, i.e. average number of bits represented by each cell, $b \equiv n/m = INT[\log_2(N^m)]/m$ takes a fractional value (i.e. a non-integer). FIG. 3 illustrates bits-per-cell b vs. word-width m for various N values.

For a given N, b varies with m. For example, for N=6, when m=1, b=2; when m=2, b=2.5 (FIG. 3). In other words, the m=2 grouping represents more bits for given number of cells than m=1, or a better efficiency. Accordingly, efficiency β is defined as the ratio between b and its theoretical limit $b_{limit}$, $\beta \equiv b/b_{limit} = \{INT[\log_2(N^m)]/m\}/\{\log_2(N^m)/m\}$ $= INT[\log_2(N^m)]/\log_2(N^m)$.

FIG. 4 illustrates efficiency β vs. word-width m for various N values. From FIG. 4, when m=1, most N-ary fractional-bit systems have a low efficiency and therefore, single-cell decoding (which is used in conventional integer-bit systems) is not suitable for a fractional-bit system. In a fractional N-ary system, because N is not an integral power of 2 and not all N-ary states are used during N-ary-to-binary encoding (see, for example, the last 4 rows of Table 3A), β does not reach 100% (FIG. 4). To ensure β≧90%, m needs to satisfy certain conditions: for N=5, m≧4; for N=6, m≧2; for N=7, m≧3 . . . (Table 2); β can be further improved by selecting m values so that β reaches a local maximum, e.g. for N=7, m preferably takes the values of 5, 10, 15, 20, 25, or 31 . . . (Table 2).

FIG. 5 illustrates a preferred N-ary fractional-bit parallel-input system. Each N-ary cell (e.g. 10a) is connected with a cell-coding block (e.g. 14a). Preferably, each cell (e.g. 10a) is first read out to a cell-coding block (e.g. 14a) and converted into j bits (e.g. 12a). Because these j bits 12a represent more states ($2^j$) than the cell states (N), they are referred to as binary-like code. Examples of binary-like code include thermometer code (FIGS. 6A–6C, Table 3A) and quasi-binary code (FIGS. 7A–7B, Table 3B). Thermometer code uses j=N−1 binary bits to represent N states, while quasi-binary code uses j=k={INT[log₂(N)]+1} binary bits to represent N states.

FIG. 6A is a symbol for a thermometer-coding block 21. Its input(s) 11a is a read-out of the cell 10a; its output(s) 12a is a thermometer code (to be explained below). FIG. 6B illustrates a first preferred thermometer-coding block 14a. It is comprised of a sense-amp 13a and N−1 latches 16a1, 16a2 . . . 16a(N−1). In this preferred embodiment, cell 10a is a N-level flash cell with N Vt levels (e.g. $V_{t,1} < V_{t,2} < V_{t,3} < \ldots < V_{t,N}$). Its state can be read out in N−1 read cycles. During each read cycle, a read voltage VR is applied to the word line 11x: if it is larger than Vt, the bit line 11a is pulled down and the sense-amp 13a outputs an "0"; if it is smaller than Vt, the bit line 11a stays high and the sense-amp 13a outputs an "1". $V_R$'s are applied in the following order: $V_{R,(N-1)} \ldots V_{R,2}, V_{R,1}$ (with $V_{t,N} > V_{R,(N-1)} > V_{t,N-1} > \ldots > V_{t,3} > V_{R,2} > V_{t,2} > V_{R,1} > V_{t,1}$). The latches 16a1, 16a2 . . . 16a(N−1) forms a shift register, which is controlled by read-cycle signal 17. After N−1 read cycles, the outputs of these latches 12a (including 12a1, 12a2 . . . 12a(N−1)) form a thermometer code. For example, for N=5, if Vt of the cell is $V_{t,3}$, the outputs 12a are: 0 (12a4), 0 (12a3), 1 (12a2), 1 (12a1); if Vt is $V_{t,5}$, the outputs 12a are: 1 (12a4), 1 (12a3), 1 (12a2), 1 (12a1) (see Table 3A for more examples). Because these outputs 12a look similar to a thermometer where the mercury column always rises to the appropriate temperature and no mercury is present above that temperature, this coding scheme is named as thermometer code.

FIG. 6C illustrates a second preferred thermometer-coding block 14a. It adopts a flash ADC architecture and is comprised of N−1 comparators 15a1, 15a2 ... 15a(N−1). In this preferred embodiment, cell 10a is viewed as a resistor during read with N possible resistance values. Hence, its bit-line voltage 19 has N possible voltage values (e.g. $V_{b,1} < V_{b,2} < V_{b,3} < \ldots < V_{b,N}$). The reference voltages of the comparators $V_{ref,1}, V_{ref,2} \ldots V_{ref,(N-1)}$ are selected in such a way that $V_{b,1} < V_{ref,1} < V_{b,2} < V_{ref,2} < V_{b,3}, \ldots < V_{b,(N-1)} < V_{ref,(N-1)} < V_{b,N}$. During read-out, the bit-line voltage 19 is compared with all reference voltages $V_{ref,1}, V_{ref,2} \ldots$ at the same time. The resultant outputs 12a are also a thermometer code.

Besides thermometer code, quasi-binary code may also be used. Quasi-binary code could have the same value as the conventional binary code (see Table 3B for examples). In general, it needs fewer bits to represent the same N states than the thermometer code. FIG. 7A illustrates a preferred quasibinary-coding block 14a. It is comprised of a thermometer-coding block 21 (as in FIGS. 6A–6C) and a thermometer-quasibinary converter 23. The thermometer-quasibinary converter 23 converts thermometer code 25a (with N−1 bits) into quasi-binary code 12a (with k bits). FIG. 7B illustrates a preferred thermometer-quasibinary converter 23. It is a $2^k$-to-k priority encoder 25, which is commonly used in the flash ADC architecture. Because $2^k > N$, only a fraction 25a of its inputs (N−1 out of a total number of $2^k$ signal lines) are used.

FIG. 8 illustrates a preferred N-ary fractional-bit serial-input system. Compared with FIG. 2B, it further comprises a cell-coding block 34 between the input 31 and the serial-to-parallel converter 30. The cell-coding block 34 reads out the state of the serial input $V_{in}$ 31 and generates a binary-like code 33 with j bit: for thermometer code, j=N−1; for quasi-binary code, j=k=INT[$\log_2(N)$]+1. Preferably, the serial-to-parallel converter 30 uses a serial-to-parallel shift register. Its operation should be apparent to those skilled in the art.

FIG. 9A illustrates a first preferred 6×2-to-2×5 encoder 102. It converts two 6-ary inputs 12a (A) and 12b (B) into one 5-bit output 18 (C). Its inputs A, B are thermometer codes, i.e. they use 5 (=6−1) signals (12a1, 12a2 ... 12a5, i.e. A1, A2 ... A5; or, 12b1, 12b2 ... 12b5, i.e. B1, B2 ... B5) to represent one 6-ary state. Table 3A lists a preferred truth table for the first preferred encoder. For example, for A=1, B=4, the thermometer codes are "00001" and "01111", the output is $C=14_6=10=01010_2$ (the subscript "6" means it is a 6-ary number; no subscript means 10-ary). Note that two 6-ary signals can represent $6^2$(=36) states, while five binary signals can represent $2^5$(=32) states. As a result, there are 4 un-used states for the encoder (see the last four rows of Table 3A).

FIG. 9B illustrates a second preferred 6×2-to-2×5 encoder 102. Its inputs A, B are quasi-binary codes, i.e. they use 3 (=INT[$\log_2(6)$]+1) signals (12a1, 12a2, 12a3, i.e. A1, A2, A3; or, 12b1, 12b2, 12b3, i.e. B1, B2, B3) to represent one 6-ary state. Table 3B lists a preferred truth table for the second preferred encoder. For example, for A=1, B=4, the quasi-binary codes are "001" and "100", the output, based on 6-ary logic, is $C=14_6=10=01010_2$.

The preferred N-ary-to-binary encoders in FIGS. 9A–9B are hard-wired for a specific N. These methods are referred to as hard-encoding. Soft-encoding, i.e. using a software means to convert N-ary to binary, may also be implemented. Accordingly, a programmable N-ary-to-binary encoder 102 is disclosed in the present invention. As is illustrated in FIG. 9C, it is comprised of a general-purpose processor 104 and a program 106. The program 106 (e.g. a software or a firmware) is written in such a way that the preferred truth table in Table 3A (or 3B) can be realized. For different N's, different programs 106 are loaded into the processor 104 to carry out different N-ary-to-binary encodings. The programmable N-ary-to-binary encoder 102 may be located on-chip, or off-chip (i.e. encoding is performed at the system level). It may share the processor with other system components, e.g. controller in flash memory or disc drives, thus lowering the system cost.

FIG. 10 illustrates a preferred N-ary memory unit-array 50. Its bit lines are divided into a plurality of words 52A, 52B ... 52X (with each word comprising m bit lines). Based on the column address 53, the column address-decoder 51 selects one word 54S from these words. The selected word 54S is fed into the cell-coding blocks 14a, 14b ... 14m, then to the N×m-to-2×n encoder 100 and converted into binary output 18 (n bits). Because N×m-to-2×n encoder 100 is located after the column address-decoder 51, it can be shared by a plurality of words in this unit-array 50. This can help reduce the chip area. In fact, an N-ary-to-binary encoder can be shared between different unit-arrays, or even between different chips. It may be located on-chip, external to the memory chip or a combination thereof.

For an N-ary system whose N in the product specification is N0, a portion of devices may not function properly at N0 after manufacturing (due to process variance) or during operation (due to wear-out). FIGS. 11A–11B illustrate two scenarios which cause smaller N values. FIG. 11A illustrates a hypothetical probability distribution for wafers with different TVW's (total Vt window). Only the portion of wafers to the right of $TVW_0$ can function properly at N0, other wafers can only support N*(e.g. N1, N2). FIG. 11B illustrates a hypothetical TVW closure with increasing P/E (programming/erasure) cycles. Here, TVW decreases from $TVW_0$ to $TVW_1$ after C0 P/E cycles, to $TVW_2$ after C1 P/E cycles. This results in smaller N values (e.g. N1, N2). It should be apparent to those skilled in the art that, besides TVW, other mechanisms may contribute to the smaller N values. One example is ECC (error correction circuits). In an ECC scheme, up to 4 error-bits may be detected and corrected within a page of 2048 data-bits and 64 ECC-bits. Operation wear-out would cause the number of error-bits to increase. When it reaches the maximum number of correctable error-bits, the chip can be still kept operational by reducing N.

To improve manufacturing yield and endurance lifetime, instead of discarding the devices malfunctioning at N0, they can be harvested at smaller N values, i.e. N*(N*<N0, e.g. N0−1, N0−2 ... ; for N=8, N*=7, 6 ... ). Accordingly, the present invention discloses a hybrid N-ary system (FIG. 14). It can be operated at multiple N-modes, e.g. N0-mode and N*-mode (these N values are collectively referred to as the N set). Here, N0 or N* may not necessarily be an integral power of 2. To determine its appropriate N-mode, N-grading test circuits are formed on wafers (FIGS. 12A–12C). Devices are then sorted or configured based on the test results (FIGS. 13A–13B).

Referring now to FIGS. 12A–12C, formations of N-grading test circuits on wafers are shown. They are formed to measure the TVW value for typical cells. FIG. 12A is drawing of a wafer 200 with active dice and scribe lines. To address the N-value variation due to manufacturing variance of FIG. 11A, the N-grading test circuits 216, 214 may be formed in the scribe line area between dices 202, 205, 206 (FIG. 12B). They do not occupy active wafer area and therefore, have no effect on productivity. To address the N-value reduction due to operation wear-out of FIG. 11B, the N-grading test circuit 231 can be formed in the active die area 208 (FIG. 12C). They provide real-time monitoring of the physical attributes (e.g. TVW) and therefore N value for chip 208 (even for each unit-array 221, 222).

Referring now to FIGS. 13A–13B, flow charts of N-binning and N-configuration methods are illustrated. During manufacturing (FIG. 13A), N-grading tests (e.g. TVW test) are performed (step 401). Based on the test results, wafers are sorted (step 403): wafers with larger N value (e.g. TVW value) are sorted into N0 bin (step 411); wafers with intermediate N value are sorted into N1 bin (step 413); wafer with small N value are sorted into N2 bin (step 415). During operation (FIG. 13B), N-grading tests (e.g. TVW test) are performed after every Ck P/E cycles (step 421). Based on the test results, memory chip can be re-configured (step 423): if TVW>TVW$_0$, N value stays the same (N0) (step 431); if TVW$_0$>TVW>TVW$_1$, N value is configured to N1 (step 433); if TVW$_1$>TVW>TVW$_2$, N value is configured to N2 (step 435).

Referring now to FIG. 14, a preferred hybrid N-ary system is illustrated. This preferred embodiment is a memory chip. Its cells can be operated at multiple N-modes, e.g. N0-mode and N*-mode. It comprises typical memory components such as memory array 300 (containing N-ary cells), row address-decoder 304, and column address-decoder 302. It further comprises an N-storage element 308 and a configurable write/read block 306. The N-storage element 308 could be laser fuse, electrical fuse, antifuse, EPROM, EEPROM, flash memory, or using the same storage mechanism of the system. The information stored therein determines the system mode. The configurable write/read block 306 supports write and read at multiple N-modes, e.g. N0-mode and N*-mode. It is comprised of a configurable N-ary-to-binary encoder. It can act as either an N0-ary-to-binary encoder or an N*-ary-to-binary encoder, depending on the N value. FIGS. 15A–15B illustrate two preferred configurable N-ary-to-binary encoders.

The preferred embodiment in FIG. 15A is based on hard-encoding and comprised of a mux 320M, a demux 320D and at least two N-ary-to-binary encoders: N0×m-to-2×n encoder 108, N*×m-to-2×n* encoder 108* (N0>N*). The mux320M and demux 320D performs selection between N0×m-to-2×n encoder 108 and N*×m-to-2×n* encoder 108*. When the system is operated at N0-mode (e.g. 8), the selection signal 316 is asserted in such a way that input signals 312a, 312b ... 312m are sent to the N0×m-to-2×n encoder 108. Here, each input signal uses j signal lines, e.g. when N0=8, j=7 for thermometer code; j=3 for binary code. On the other hand, when it is operated at N*-mode (e.g. 7, 6 ... ), the selection signal 316 is asserted in another way such that input signals 312a, 312b ... 312m are sent to the N*×m-to-2×n* encoder 108*. Here, each input signal uses j* signals line, e.g. if N*=7, j*=6 for thermometer code; j*=3 for quasi-binary code.

FIG. 15B illustrates a second preferred configurable N-ary-to-binary encoder 310. Based on soft-encoding, it is a programmable N-ary-to-binary encoder (as in FIG. 9C) and uses a general-purpose processor 104. This preferred encoder may share the processor with other system components, e.g. controller in flash memory or disc drives. This is particularly advantageous because it does not incur extra chip overhead and can be made N (or even m)-programmable.

In a configurable N-ary-to-binary encoder with inputs from m cells, the m value can be selected to ensure good overall efficiency β for the N set (i.e. all N's the hybrid storage needs to support, e.g. N0 and all N*). One case is to ensure β≧90% for every member in the N set, e.g. m≧4 for N=5, 6, and 7 (Table 2). Another case is to ensure that β reaches local maxima for at least two members in the N set, e.g. m=4 or 7 for N=5, 6, and 7 (Table 2).

While illustrative embodiments have been shown and described, it would be apparent to those skilled in the art that may more modifications than that have been mentioned above are possible without departing from the inventive concepts set forth therein. The invention, therefore, is not to be limited except in the spirit of the appended claims.

What is claimed is:

1. A hybrid N-ary storage system, comprising:
   a group of m N-ary storage cells, all cells within said group having the same number of possible states N, with N having at least two possible values N0 and N*(N0>N*);
   a configurable N-ary-to-binary encoder for converting the information stored in said group of m storage cells into n bits of binary code, said encoder being configured to an N0-ary-to-binary encoder when N=N0, and an N*-ary-to-binary encoder when N=N*;
   wherein N, N0, N* represent the number of possible states for each cell, m is the number of storage cells in said group, n is the number of output binary bits from said encoder, with N, N0, N*, m, n all integers.

2. The hybrid N-ary storage system according to claim 1, wherein the maximum n=INT[log$_2$(N$^m$)] and INT[x] is the largest integer smaller than x.

3. The hybrid N-ary storage system according to claim 1, wherein said m is selected in such a way that efficiencies β=INT[log$_2$(N$^m$)]/log$_2$(N$^m$) for both N=N0 and N=N* are ≧90%.

4. The hybrid N-ary storage system according to claim 1, wherein said m is selected in such a way that efficiencies β=INT[log$_2$(N$^m$)]/log$_2$(N$^m$) for both N=N0 and N=N* reach local maxima.

5. The hybrid N-ary storage system according to claim 1, wherein a selected one of said N0, N* is an integral power of 2 and the other selected one of said N0, N* is not an integral power of 2.

6. The hybrid N-ary storage system according to claim 1, wherein said encoder comprises m cell-coding blocks, each cell-coding block converting the read-out from each cell into a binary-like code.

7. The hybrid N-ary storage system according to claim 6, wherein said binary-like code is thermometer-code or quasibinary-code.

8. The hybrid N-ary storage system according to claim 1, wherein said encoder is a programmable encoder.

9. The hybrid N-ary storage system according to claim 8, wherein said encoder comprises a processor or a program.

10. The hybrid N-ary storage system according to claim 1, wherein said N or said m is programmable for said encoder.

11. The hybrid N-ary storage system according to claim 1, further comprising an N-storage element for determining the configuration of said encoder.

12. The hybrid N-ary storage system according to claim 1, wherein said storage cells are in a semiconductor memory or a disc-based storage.

13. A hybrid N-ary storage system, comprising:

first and second groups of m N-ary storage cells, all cells within either one of said first and second groups having the same number of possible states N, with N having at least two possible values N0 and N*(N0>N*);

selection means for selecting a group from first and second groups; and a configurable N-ary-to-binary encoder for converting the information from said selected group into n bits of binary code, said encoder being configured to an N0-ary-to-binary encoder when N=N0, and an N*-ary-to-binary encoder when N=N*;

wherein N, N0, N* represent the number of possible states for each cell, m is the number of storage cells in said group, n is the number of output binary bits from said encoder, with N, N0, N*, m, n all integers.

14. The hybrid N-ary storage system according to claim 13, wherein the maximum n=INT[$\log_2(N^m)$] and INT[x] is the largest integer smaller than x.

15. The hybrid N-ary storage system according to claim 13, wherein said m is selected in such a way that efficiencies $\beta$=INT[$\log_2(N^m)$]/$\log_2(N^m)$ for both N=N0 and N=N* are $\geq$90%.

16. The hybrid N-ary storage system according to claim 13, wherein said m is selected in such a way that efficiencies $\beta$=INT[$\log_2(N^m)$]/$\log_2(N^m)$ for both N=N0 and N=N* reach local maxima.

17. The hybrid N-ary storage system according to claim 13, wherein a selected one of said N0, N* is an integral power of 2 and the other selected one of said N0, N* is not an integral power of 2.

18. The hybrid N-ary storage system according to claim 13, wherein said first and second groups are located in a same unit-array, in different unit-arrays, or in different chips.

19. The hybrid N-ary storage system according to claim 13, wherein said encoder is located in a same chip as said cells or a different chip from said cells.

20. The hybrid N-ary storage system according to claim 13, wherein said storage cells are in a semiconductor memory or a disc-based storage.

* * * * *